United States Patent [19]

Fujinaga

[11] Patent Number: 5,502,643
[45] Date of Patent: Mar. 26, 1996

[54] METHOD OF AND AN APPARATUS FOR SETTING UP PARAMETERS WHICH ARE USED TO MANUFACTURE A SEMICONDUCTOR DEVICE

[75] Inventor: Masato Fujinaga, Itami, Japan

[73] Assignee: Mitsubishi Denki Kabushiki Kaisha, Tokyo, Japan

[21] Appl. No.: 991,362

[22] Filed: Dec. 15, 1992

[30] Foreign Application Priority Data

Apr. 16, 1992 [JP] Japan .................................. 4-096215

[51] Int. Cl.$^6$ ............................................... G06F 17/50
[52] U.S. Cl. ................................................ 364/488; 364/578
[58] Field of Search ................................ 364/488, 489, 364/578; 437/27, 29, 51; 257/438

[56] References Cited

U.S. PATENT DOCUMENTS

| | | | |
|---|---|---|---|
| 3,628,137 | 12/1971 | Mazur | 364/490 |
| 3,891,468 | 6/1975 | Ito et al. | 437/29 |
| 4,142,200 | 2/1979 | Mizushima et al. | 257/438 |
| 4,616,404 | 10/1986 | Wang et al. | 437/51 |

OTHER PUBLICATIONS

Journal of the Electrochemical Society, Dec. 1978, pp. 2050–2058, Richard B. Fair, et al., "Theory and Direct Measurement of Boron Segregation in $SiO_2$ During, Near Dry and Wet $O_2$ Oxidation".

Journal of the Electrochemical Society, May 1978, pp. 813–819, Dimitri A. Antoniadis, et al., "Boron in Near-Intrinsic <100> and <111> Silicon Under Inert and Oxidizing Ambients–Diffusion and Segregation".

Journal of the Electrochemical Society, Nov. 1979, pp. 1939–1945, D. A. Antoniadis, et al., "Impurity Redistribution in $SiO_2$–Si During Oxidation: A Numerical Solution Including Interfacial Fluxes".

*Primary Examiner*—Vincent N. Trans
*Attorney, Agent, or Firm*—Oblon, Spivak, McClelland, Maier & Neustadt

[57] ABSTRACT

Improved setup of process parameters for manufacturing of a semiconductor device is disclosed. Using parameters which are necessary for attaining a threshold voltage of a semiconductor device, process simulation is performed to thereby compute the threshold voltage. Whether the computed threshold voltage has a predetermined value is then judged. The parameters are updated until the predetermined value is reached. The simulation involves partitioning the semiconductor device into fine discrete cells. A boundary region is defined which delineates neighboring cells. Since a range of the boundary region is considered in the simulation, prediction of impurity concentration is accurate.

22 Claims, 12 Drawing Sheets

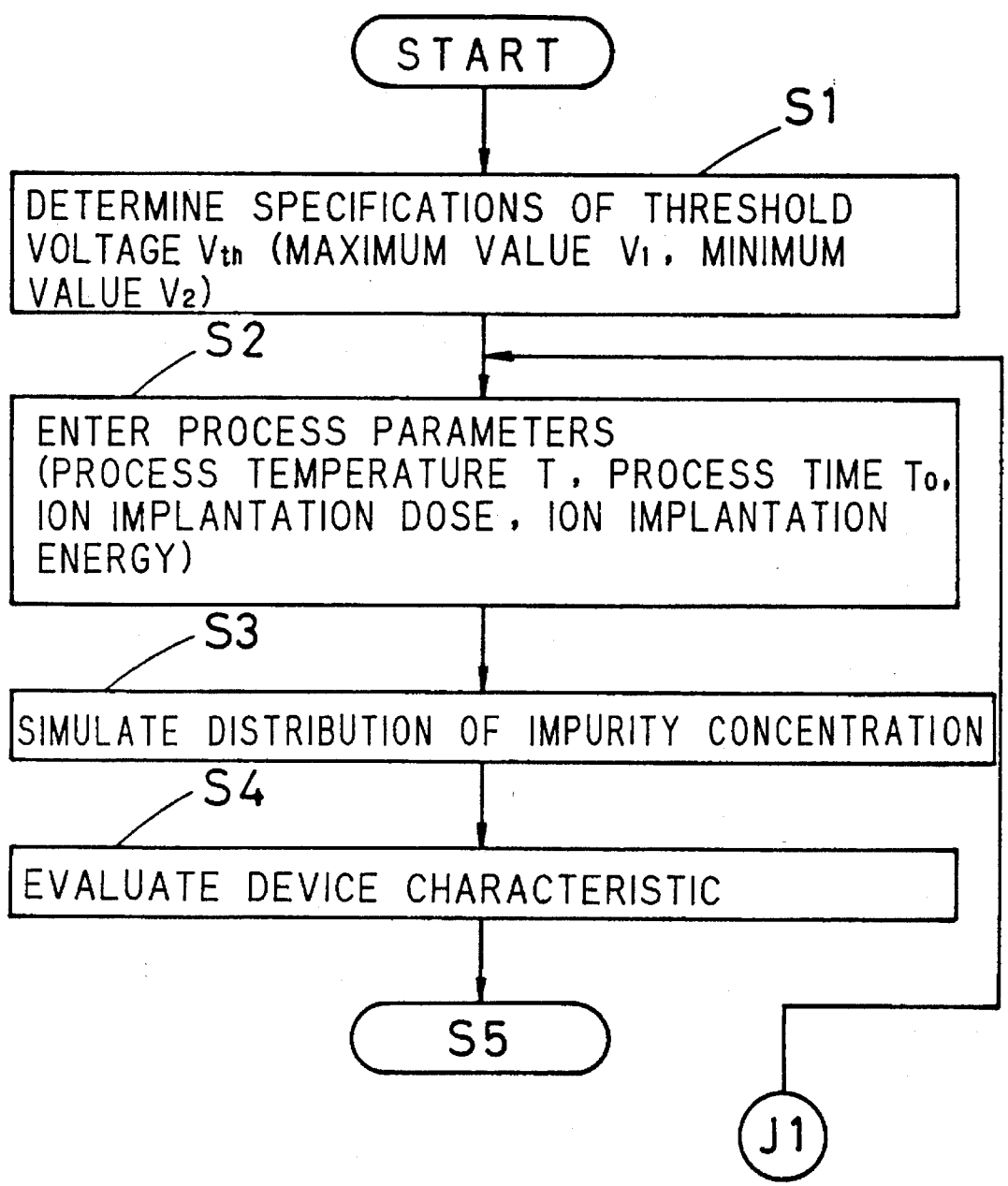

METHOD OF AND AN APPARATUS FOR SETTING UP PARAMETERS WHICH ARE USED TO MANUFACTURE A SEMICONDUCTOR DEVICE

BACKGROUND OF THE INVENTION

1. Field of the Invention

The present invention relates to a technique for setting up parameters which are used in a manufacturing process of a semiconductor device and a fine element of an integrated circuit.

2. Description of the Background Art

FIG. 1 is a conceptual diagram of a conventional segregation model which is now in use in a manufacturing process of a semiconductor device. In FIG. 1, a position z is measured along the horizontal axis, and an impurity concentration is measured along the vertical axis as a function of the position z. $SiO_2$ (oxide film) is in the region 1 where the position z has a negative value and Si (silicon) is in the region 2 where the position z has a positive value. Two different impurity concentrations $C_1$ and $C_2$ are set at an interface, where the position z is zero. The values $C_1$ and $C_2$ are impurity concentrations of the oxide film and silicon, respectively, at the interface.

In FIG. 1, the dotted line represents a dopant flux Fs (density of flow $1/(cm^2 \cdot sec)$) across the interface.

The conventional segregation model assumes that the interface has no range. Hence, as shown in FIG. 1, a concentration C of such doping species as B (boron), P (phosphorus) and As (arsenic) is discontinuous across the interface, and so are the densities of $SiO_2$ (oxide film) and Si (silicon).

Using this segregation model, the dopant flux Fs across the interface is $Fs=h \cdot (C_1-C_2/m)$ where h is a mass-transfer coefficient (cm/sec), and m is a segregation coefficient (dimensionless).

The equation above states that the interfacial dopant flux Fs is created in such a manner that a ratio of the impurity concentrations $C_2/C_1$ is equal to the segregation coefficient m.

The conventional segregation model, which gives different impurity concentrations at the same position (z=0), or the interface, has grave disagreement with a physical phenomenon: that is, a distribution of impurity concentration gradually ranges from ten angstrom to several tens angstrom across an $SiO_2/Si$ interface.

Hence, the conventional segregation model is not practical enough for parameter setup to accurately set an impurity concentration near an interface, e.g., to adjust a threshold voltage $V_{th}$ of a MOS transistor within a predetermined range.

In order to predict a diffusion profile with such accuracy using the conventional segregation model, parameters for different manufacturing process steps must be set by computing an impurity concentration for each manufacturing process step in light of the mass-transfer coefficient h and the segregation coefficient m.

SUMMARY OF THE INVENTION

The present invention relates to a method of setting up process parameters which are used in a manufacturing process of a semiconductor device. A method according to a first aspect comprises the steps of: (a) entering a plurality of process parameters; (b) calculating an impurity concentration C which will be observed in the semiconductor device, the impurity concentration C being a function of a position z within the semiconductor device using the process parameters; (c) judging whether the impurity concentration C has a predetermined value; (d) if a judgement at the step (c) is "No," updating the process parameters and repeating the steps (b) and (c) until the judgement at the step (c) becomes "Yes;" and (e) determining the process parameters with which the judgement at the step (c) is "Yes" as process parameters to be obtained, wherein the step (b) involves defining a boundary region between abutting first and second materials and performing a calculation using a model in which the impurity concentration C continuously varies with the position z across the boundary region.

A method according to a second aspect comprises the steps of: (a) entering a plurality of process parameters; (b) calculating an impurity concentration C which will be observed in the semiconductor device using the process parameters, the impurity concentration C being a function of a position z in the semiconductor device and a time t; (c) simulating a characteristic of the semiconductor device from the impurity concentration C; (d) judging whether the characteristic has a predetermined value; (e) if a judgement at the step (d) is "No," updating the process parameters and repeating the steps (b) and (d) until the judgement at the step (d) becomes "Yes;" and (f) setting up the process parameters with which the judgement at the step (d) is "Yes" as process parameters to be obtained, wherein the step (b) involves defining a boundary region between abutting first and second materials and performing a calculation using a model in which the impurity concentration C continuously varies with the position z across the boundary region.

In the second aspect of method, the step (b) may involve at least one of a diffusion calculation, oxidation calculation and epitaxy calculation, the diffusion calculation, the oxidation calculation and the epitaxy calculation corresponding to a diffusion process, oxidation process and epitaxy process, respectively.

Further, the process parameters may include a process temperature T, a process time $t_0$, an ion implantation dose and an ion implantation energy.

Further, the step (b) may further involve ion implantation calculation which corresponds to ion implantation process.

Further, the step (b) may include: in the ion implantation calculation, the step of (b-1) calculating an initial value of the impurity concentration C from the ion implantation dose and the ion implantation energy; in the diffusion calculation, the step (b-2) calculating a dopant flux Fs at a time t using the impurity concentration C and the process temperature T, the step (b-3) updating the impurity concentration C using the dopant flux Fs, and the step (b-4) adding a predetermined time step to the time t to thereby update the time t, and repeating the steps (b-2) and (b-3) until the calculation arrives at the process time $t_0$.

Further, the step (b-2) may include the steps of: (b-2-1) calculating a diffusion coefficient D from the process temperature T; (b-2-2) calculating a segregation coefficient m from the process temperature T; and (b-2-3) calculating the dopant flux Fs from the diffusion coefficient D, the segregation coefficient m and the impurity concentration C, according to the equation below $$Fs = -D \cdot m \cdot [\partial(C/m)/\partial z].$$

The predetermined time step may be determined from the dopant flux Fs.

The step (b) may further involve an etching calculation, deposition calculation and optical lithography calculation which correspond to an etching process, deposition process and optical lithography process, respectively.

The semiconductor device is preferably a MOS transistor, and the characteristic is preferably a threshold value of the MOS transistor.

The present invention also relates to an apparatus for setting up process parameters which are used in a manufacturing process of a semiconductor device. An apparatus according to a first aspect comprises: an input part to which a plurality of process parameters are entered; a process simulation part for calculating an impurity concentration C which will be observed in the semiconductor device using the process parameters, the impurity concentration C being a function of a position z within the semiconductor device; a judging part for judging whether the impurity concentration C has a predetermined value; a parameter updating part for updating the process parameters if the judgement is "No" until the judgement becomes "Yes;" and an output part for determining the process parameters with which the judgement is "Yes" as process parameters to be obtained and outputting the process parameters, wherein in the process simulation part, a boundary region between abutting first and second materials is defined and a calculation is performed using a model in which the impurity concentration C continuously varies with the position z across the boundary region.

An apparatus according to a second aspect comprises: an input part to which a plurality of process parameters are entered; a process simulation part for calculating an impurity concentration C which will be observed in the semiconductor device using the process parameters, the impurity concentration C being a function of a position z within the semiconductor device and a time t; a judging part for judging whether the impurity concentration C has a predetermined value; a parameter updating part for updating the process parameters if the judgement is "No" until the judgement becomes "Yes;" and an output part for determining the process parameters with which the judgement is "Yes" as process parameters to be obtained and outputting the process parameters, wherein in the process simulation part, a boundary region between abutting first and second materials is defined and a calculation is performed using a model in which the impurity concentration C continuously varies with the position z across the boundary region.

In the second aspect of the apparatus, the process simulation part may perform at least one of a diffusion calculation, oxidation calculation and epitaxy calculation, the diffusion calculation, the oxidation calculation and the epitaxy calculation corresponding to a diffusion process, oxidation process and epitaxy process, respectively.

Further, the process parameters may include a process temperature T, a process time $t_0$, an ion implantation dose and an ion implantation energy.

The process simulation part may further performs ion implantation calculation which corresponds to ion implantation process.

In the ion implantation calculation, an initial value of the impurity concentration C may be calculated from the ion implantation dose and the ion implantation energy; in the diffusion calculation, a dopant flux Fs at a time t may be calculated from the impurity concentration C and the process temperature T, and a predetermined time step is added to the time t to thereby update the time t, wherein updating of the impurity concentration C is continued using the dopant flux Fs until the calculation arrives at the process time $t_0$.

Preferably, a diffusion coefficient D and a segregation coefficient m are calculated from the process temperature T, and thereafter, the dopant flux Fs is calculated from the diffusion coefficient D, the segregation coefficient m and the impurity concentration C, according to the equation below $$Fs = -D \cdot m \cdot [\partial(C/m)\partial z].$$

The predetermined time step may be determined from the dopant flux Fs.

The process simulation part may perform an etching calculation, deposition calculation and optical lithography calculation which correspond to an etching process, deposition process and optical lithography process, respectively.

The semiconductor device is preferably a MOS transistor, and the characteristic is preferably a threshold value of the MOS transistor.

Thus, calculation of the impurity concentration C at the process simulation part involves defining of the boundary region which delineates neighboring first and second cells. In the model used therein, the impurity concentration C continuously varies with the position z across the boundary region.

Hence, the impurity concentration C will never be calculated as a value which becomes discontinuous across the first and the second cells, thereby allowing that the process simulation generally agrees with an actual physical phenomenon.

If process parameters are set up by such simulation, it is not necessary to change a mass-transfer coefficient and a segregation coefficient for different manufacturing process steps. Thus, setup of process parameter needs not to be modified.

Accordingly, it is an object of the present invention to attain accurate prediction of impurity concentration and appropriate setup of process parameters.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 and 4 show in combination a flow chart which explains the preferred embodiment;

DESCRIPTION OF THE PREFERRED EMBODIMENTS

A. Overall System

Figure 4:
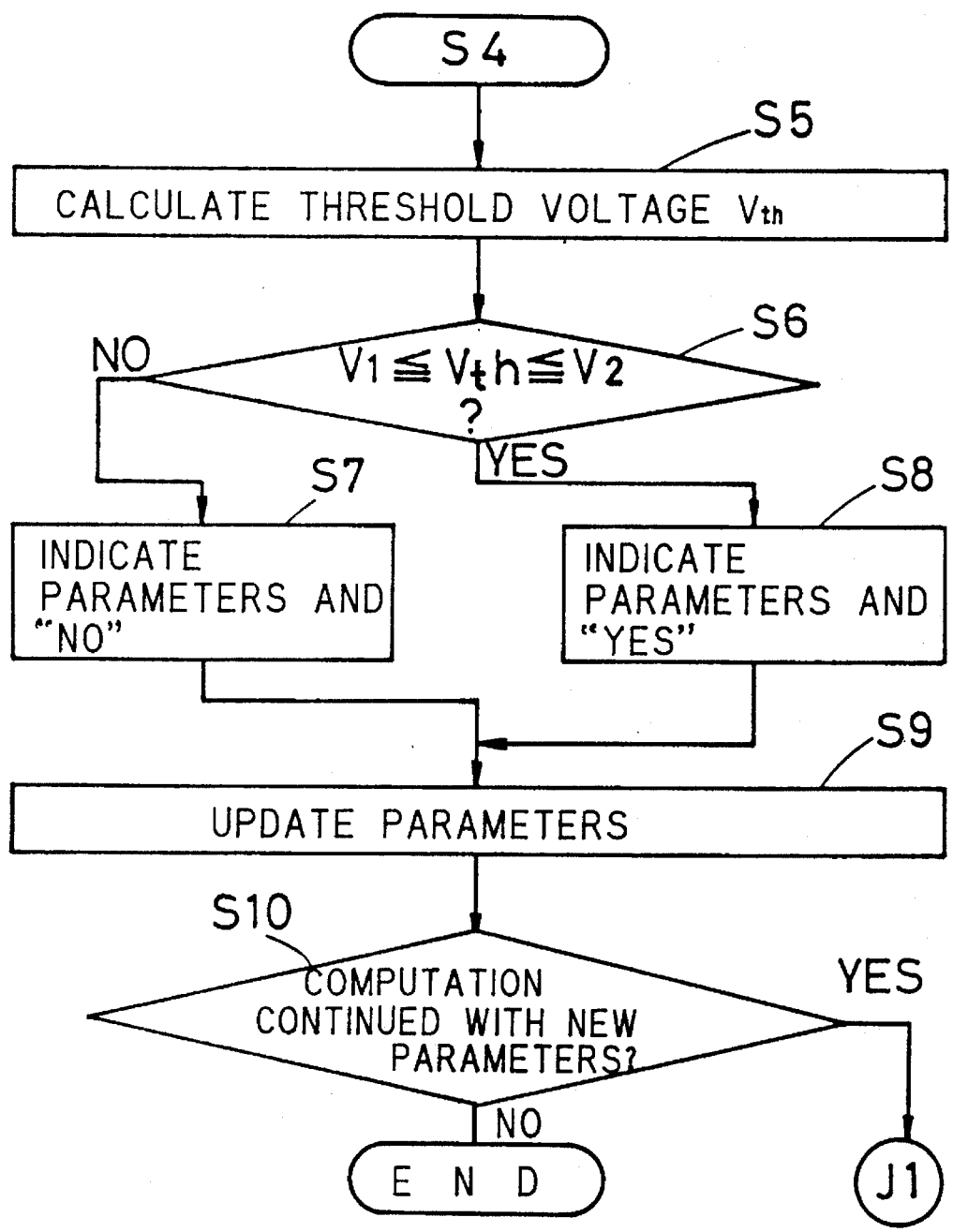

FIGS. 3 and 4 in combination shows a flow chart depicting an overall system according to the present invention to set up parameters which are used in a manufacturing process of a semiconductor device.

The following describes parameter setup for a MOS transistor aiming at adjusting a threshold voltage $V_{th}$ within a predetermined range.

Step S1 involves determining the predetermined range, i.e., specifications of the threshold voltage. That is, a maximum threshold voltage $V_1$ and a minimum threshold voltage $V_2$ are determined.

Next, process parameters for each process step are determined in a step S2. The process parameters include a process temperature T, a process time $T_0$, and a dose and an energy of ion implantation. In a subsequent step S3, a distribution of impurity concentration in a MOS transistor is simulated, followed by computation of a device characteristic in a step S4.

It is then simulated how large the threshold voltage $V_{th}$ will be in the MOS transistor which is developed with the parameters which are used in the step S2 (step S5). Following this, it is judged if the computed threshold voltage $V_{th}$ satisfies the specifications determined in the step S1 (step S6). The result of the judgement is indicated beside the process parameters (steps S7 and S8), and the parameters are updated (step S9). If the threshold voltage $V_{th}$ needs to be newly set up with the new parameters, the simulation returns to the step S2.

Figure 5:
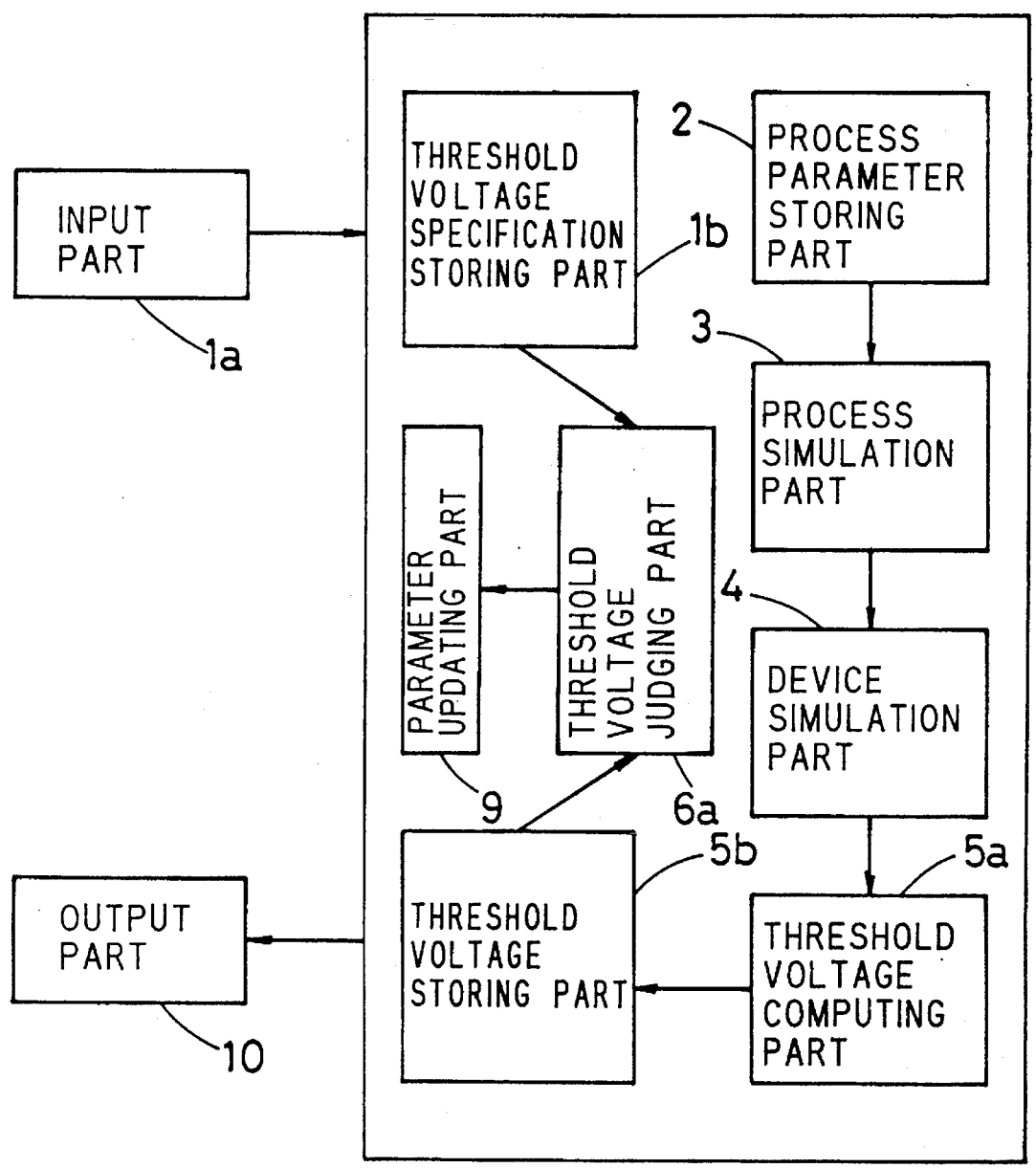
FIG. 5 is a block diagram for explaining the preferred embodiment.

An apparatus for simulating the threshold voltage $V_{th}$ in this manner has a structure as shown in FIG. 5. The specifications $V_1$ and $V_2$ of the threshold voltage are entered in an input part 1a and then stored once in a threshold voltage specification storing part 1b. This corresponds to the step S1 of FIG. 3.

The input part 1a also receives the process parameters which are subsequently once stored in a process parameter storing part 2. The process parameter storing part 2 corresponds to the step S2.

The impurity concentration is simulated in a process simulation part 3, which corresponds to the step S3. The device characteristic of the semiconductor device, namely, the MOS transistor is computed in a device simulation part 4. This corresponds to the step S4.

The threshold voltage $V_{th}$ is computed in a threshold voltage computing part 5a and a result of the computation is stored in a threshold voltage storing part 5b. This corresponds to the step S5.

A threshold voltage judging part 6a compares the maximum and the minimum threshold voltages $V_1$ and $V_2$, which are stored in the threshold voltage specification storing part 1b, with the computed threshold voltage $V_{th}$, which is stored in the threshold voltage storing part 5b. The judgement of the step S6 is also executed in the threshold voltage judging part 6a.

If update of the process parameters turns out to be necessary as a result of the judgement, the process simulation part 3 simulates impurity concentration once again using new parameters stored in a parameter updating part 9. If not, the parameters as currently valid are outputted at an output part 10. The parameters outputted at the output part 10 are used in an actual manufacturing process of a MOS transistor. If developed with these parameters, the threshold voltage $V_{th}$ a MOS transistor falls within the predetermined range.

B. Computation of Impurity Concentration (B-1). Computation Method

Description will be given on how an impurity concentration is computed in the step S3. The computation of impurity concentration needs to be executed as to thermal treatment which induces a dopant flow.

Figure 6:
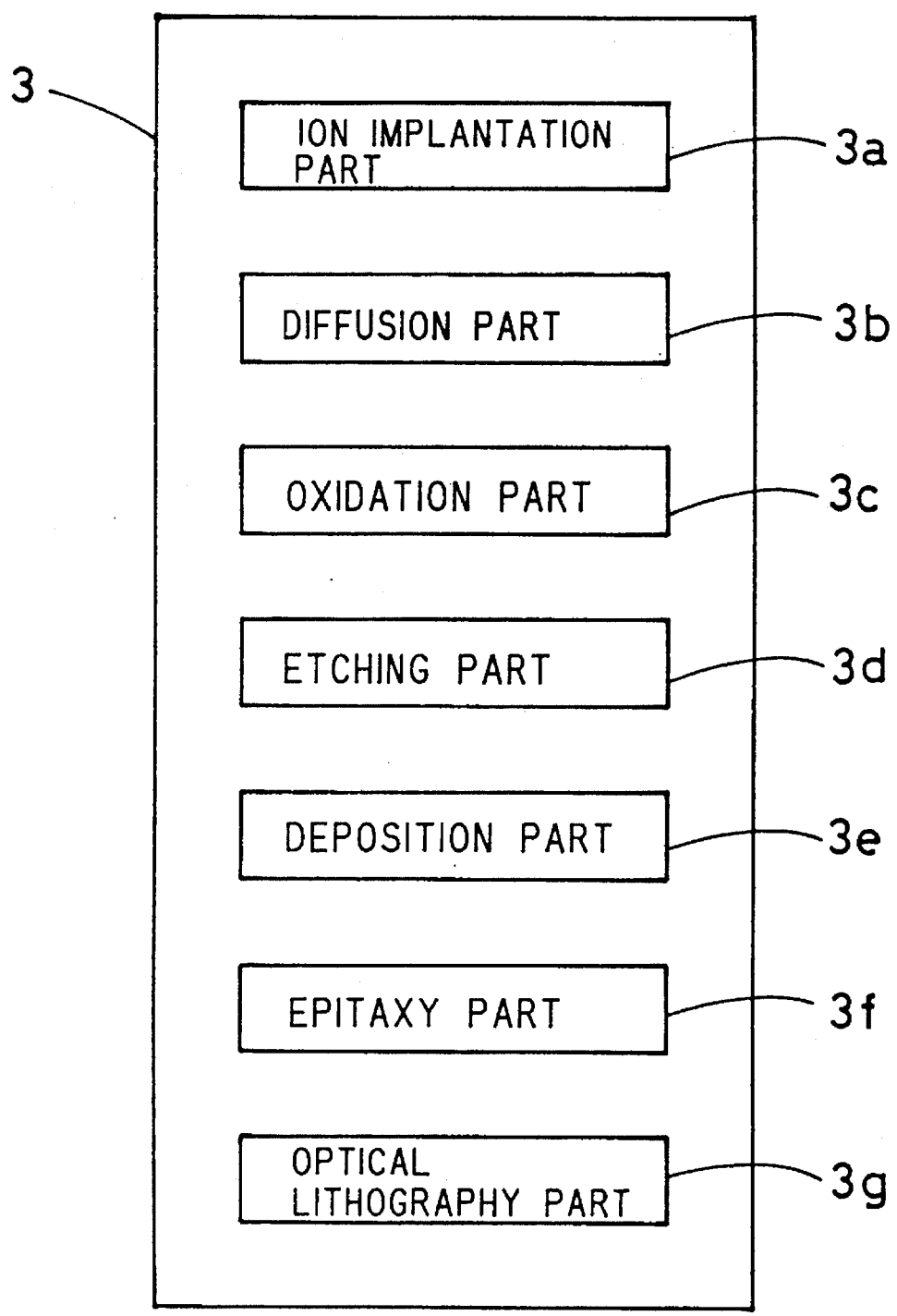
FIG. 6 is a block diagram of a process simulation part.

As shown in FIG. 6, the process simulation part 3 is comprised of an ion implantation part 3a, a diffusion part 3b, an oxidation part 3c, an etching part 3d, a deposition part 3e, an epitaxy part 3f and a photolithography part 3g. Each of an actual ion implantation, diffusion, oxidation, etching, deposition, epitaxy and photolithography treatment is simulated in the associated part of the process simulation part 3.

Among these parts constituting the process simulation part 3, the diffusion part 3b, the oxidation part 3c and the epitaxy part 3f, especially, are responsible for numerical simulation of impurity concentration. For simplicity of presentation, only simulation at the diffusion part 3b will be described on an assumption that initial impurity distribution values have been already calculated and entered in the diffusion part 3b based on parameters such as a dose and an energy of ion implantation.

Figure 7:
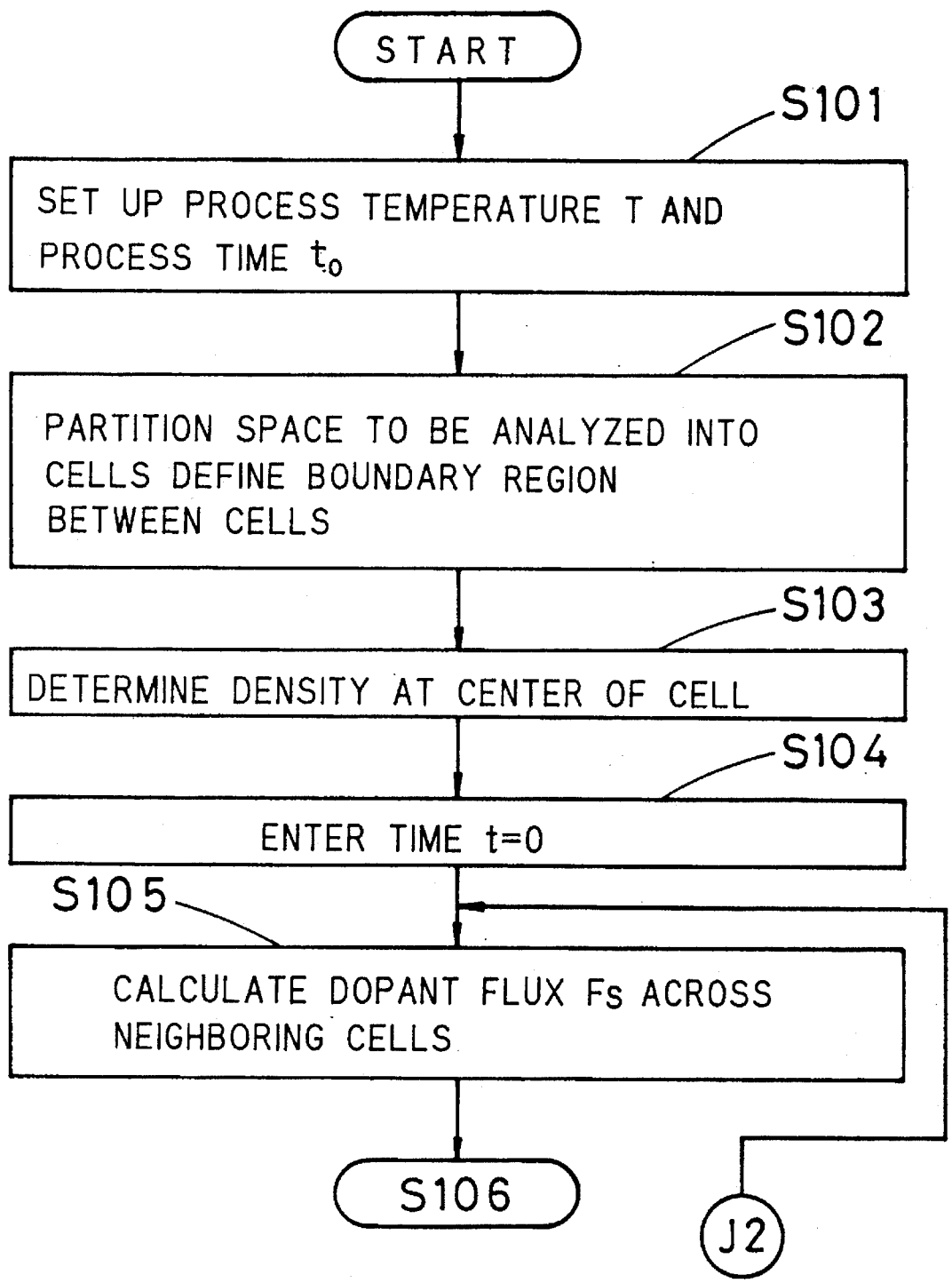
FIGS. 7 and 8 show in combination a flow chart which explains procedures performed by a diffusion part.
Figure 8:
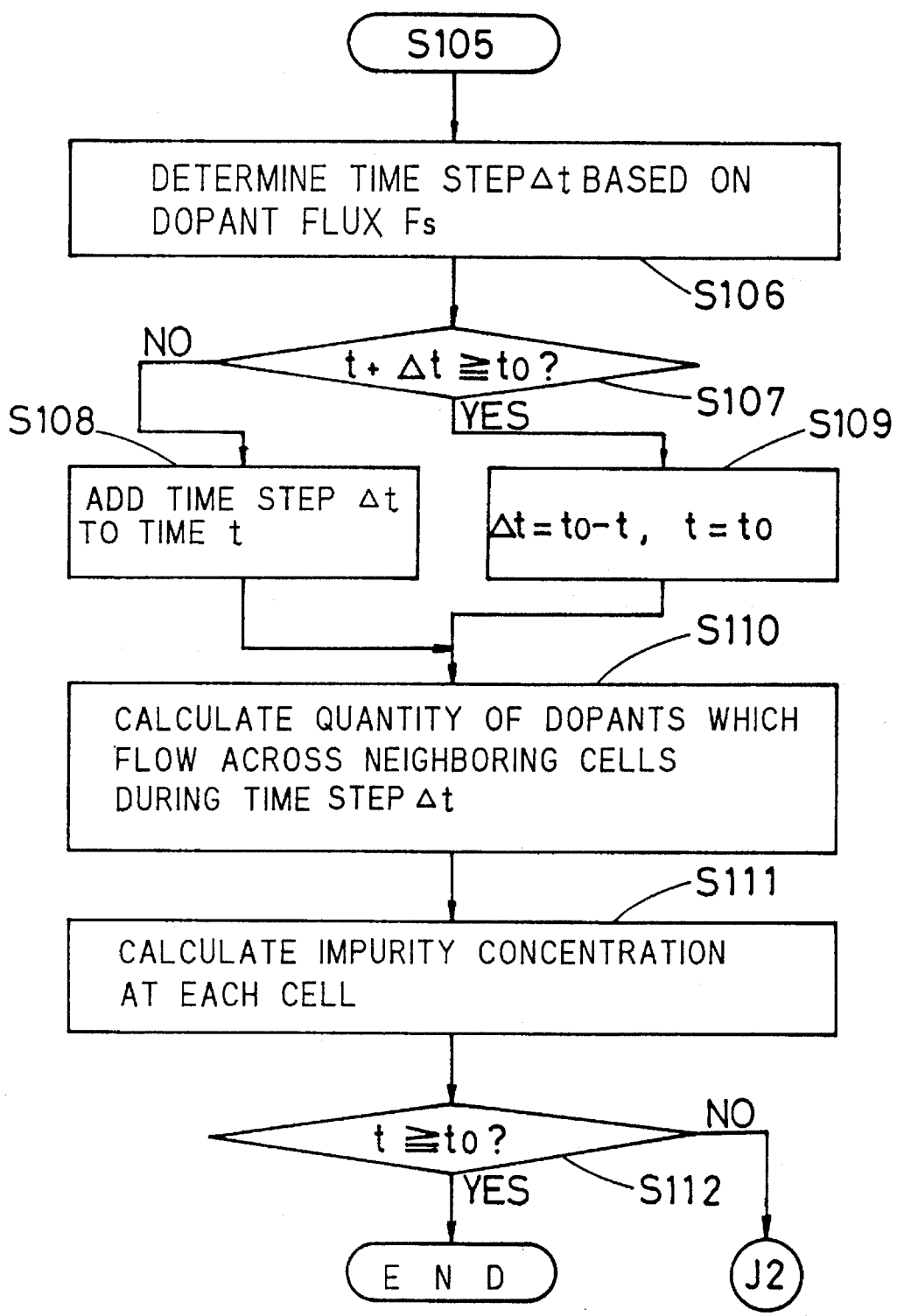
Figure 9:
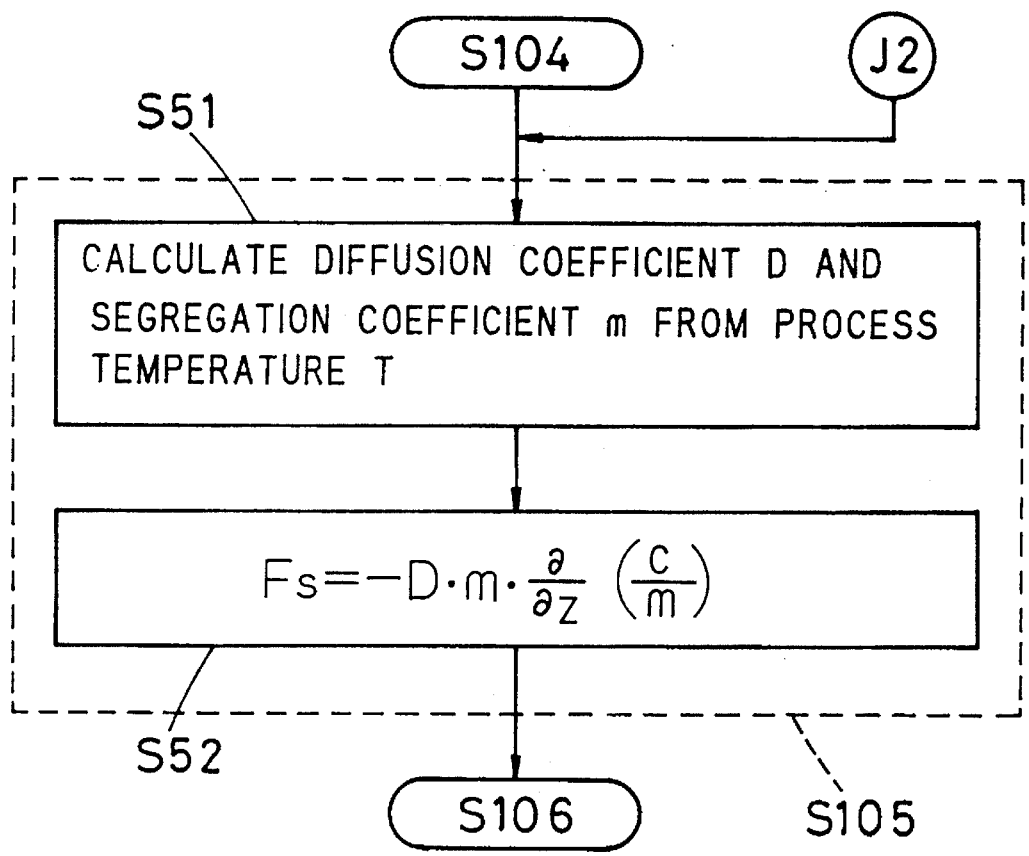
FIG. 9 is a flow chart depicting step S105 in detail.

FIGS. 7 to 9 are flow charts depicting a sequence of steps to compute impurity concentration. First, a process temperature T and a process time $t_0$ during diffusion are entered (step S101). Next, a space to be analyzed is partitioned into fine discrete areas, i.e., cells (step S102). In this space discretization, cell boundary regions are defined which delineate neighboring cells as described later.

The initial impurity concentration is then entered which has been already assigned to a center of each cell (step S103) to thereby initialize a process time t (step S104). The process time t is led by a time step $\Delta t$, immediately followed by steps S105 to S112. This is repeated until computation arrives at the process time $t_0$ (steps S107 to S109 and S112).

(B-2) Segregation Model

Before moving on to explain steps S105, S106 and S110, a segregation model used in the present invention will be described.

Figure 1:
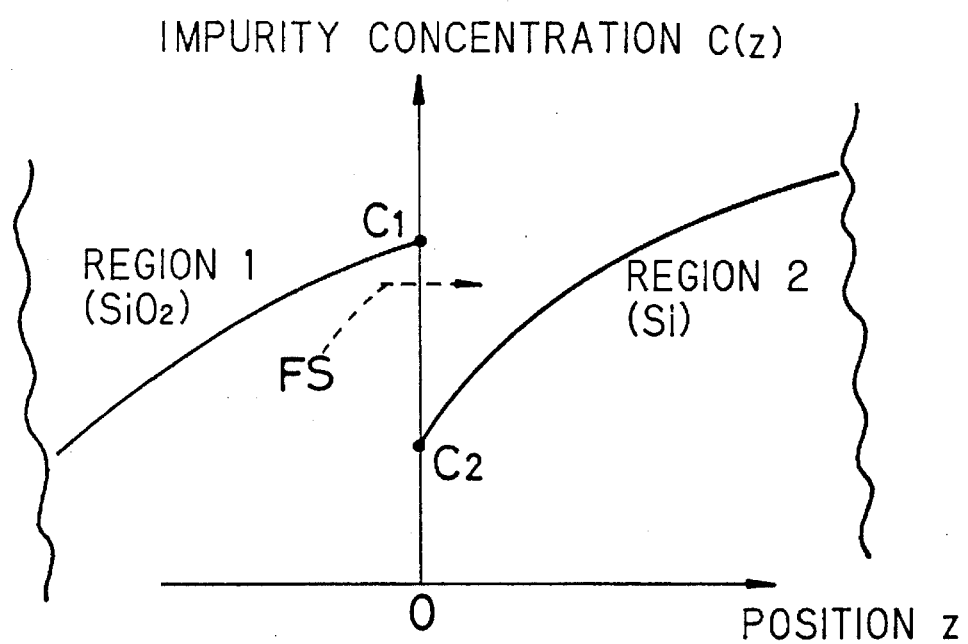
FIG. 1 is a graph for explaining a conventional technique.
Figure 2A:
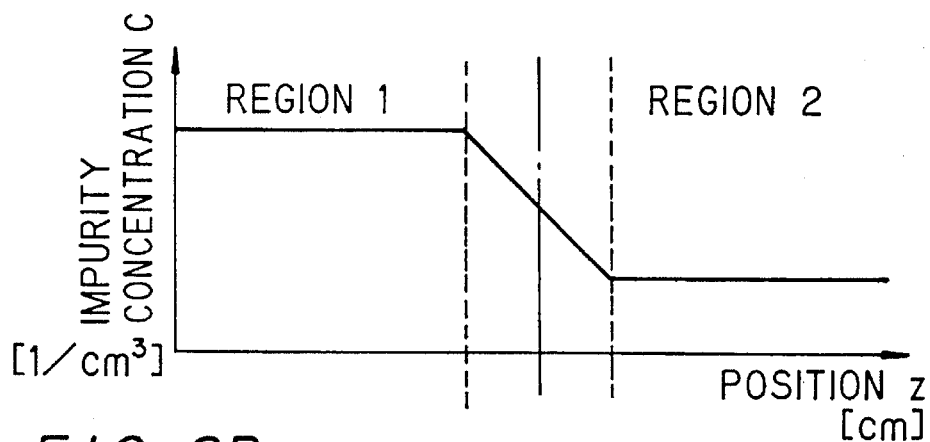
FIGS. 2A to 2C are graphs representing a segregation model used in a preferred embodiment of the present invention.
Figure 2B:
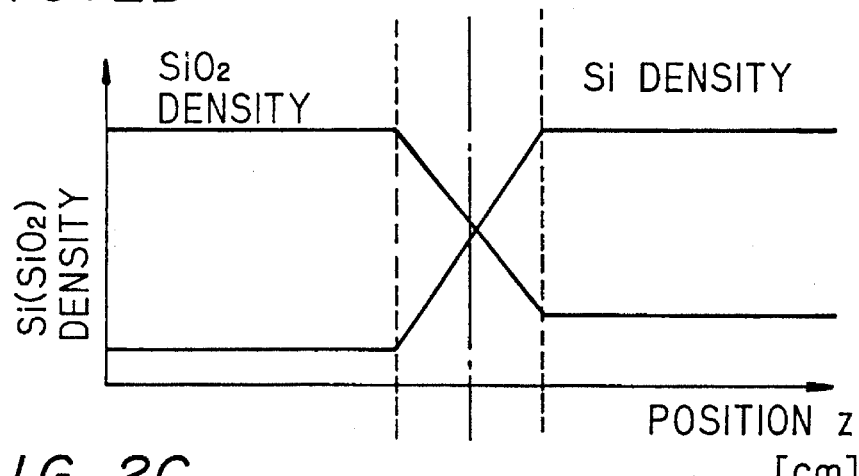
Figure 2C:
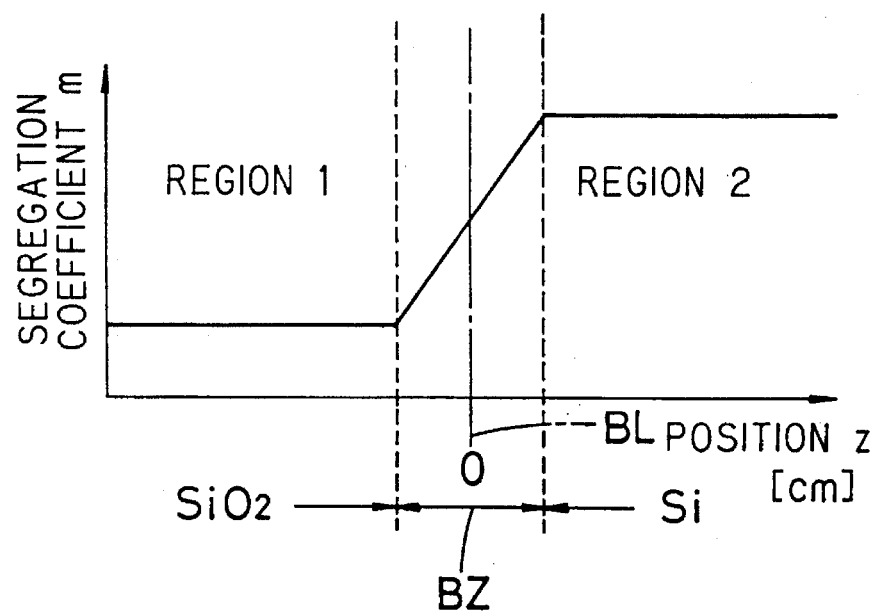

FIGS. 2A to 2C are graphs explaining the segregation model according to the present invention. An impurity concentration C, a density of Si ($SiO_2$) and a segregation coefficient m are respectively plotted against a position z in FIGS. 2A, 2B and 2C. On the left of an interface BL (z=0) is $SiO_2$ side (region 1) and on the right of the interface BL is Si side (region 2).

In the improved segregation model, a boundary region BZ having a certain range is considered which includes the interface BL. Hence, the impurity concentration C, the density of Si ($SiO_2$) and the segregation coefficient m continuously vary in the boundary region BZ, which is in sharp contrast with the conventional segregation model where different physical values are set at the same position in a physically impractical manner.

According to the Nerst-Einstein rule, an average velocity of particles v is:

$$v = -\frac{D}{kT} \frac{\partial(\Delta\mu)}{\partial z} \quad (1)$$

where $\Delta\mu$, is a chemical potential difference, D is a diffusion coefficient, k is a Boltzmann's constant, and T is a temperature. On the other hand, the dopant flux Fs is:

$$Fs = -D\frac{\partial C}{\partial z} + vC \quad (2)$$
$$= -D\frac{\partial C}{\partial z} - \frac{D}{kT}\frac{\partial(\delta\mu)}{\partial z} C$$

The first term on the right side of Eq. 2 are diffusion terms, and the second terms on the right side of Eq. 2 represent a dopant flux which is induced by segregation, respectively.

According to "Theory and Direct Measurement of Boron Segregation in SiO$_2$ during Dry, Near Dry, and Wet O$_2$ Oxidation," R. B. Fair and J. C. C. Tsai, J. Electrochem. Soc., December 1978, pgs. 2050–2058, the segregation coefficient m is given as:

$$m = \frac{X_S}{X_{g1}} = \left(\frac{\gamma_{g1}}{\gamma_S}\right) \exp\left(-\frac{\Delta G^0}{RT}\right) \quad (3)$$

where $X_S$ and $X_{g1}$ are molar fractions, and $\gamma_{g1}$ and $\gamma_S$ are activated coefficients. Therefore, Eq. 4 below holds where $m_0$ is a constant:

$$BO_{3/2} + 3/4\, Si \underset{K_1}{=} B + 3/4\, SiO_2 \quad (4)$$

$$K_1(T) = \frac{\gamma_S X_S}{\gamma_{g1} X_{g1}}$$

$$\frac{\Delta G^0}{RT} = \frac{\Delta \mu}{kT}$$

$$R = N_0 \cdot K$$

$$m = m_0 \cdot \exp\left(-\frac{\Delta \mu}{kT}\right)$$

$$\Delta \mu = -kT \cdot \ln\left(\frac{m}{m_0}\right)$$

Hence, from Eqs. 3 and 4, $$\frac{\partial(\Delta \mu)}{\partial z} = -kT \cdot \frac{1}{m} \cdot \frac{\partial m}{\partial z} \quad (5)$$

and therefore, from Eqs. 5 and 2,

Eq. 6 is satisfied as to not only the regions 1 and 2 but also the boundary $$\begin{aligned} Fs &= -D\frac{\partial C}{\partial z} + \frac{1}{m} \cdot \frac{\partial m}{\partial z} \cdot C \\ &= -D \cdot m \cdot \left[\frac{1}{m} \cdot \frac{\partial C}{\partial z} - \frac{1}{m^2} \cdot \frac{\partial m}{\partial z} \cdot C\right] \\ &= -D \cdot m \cdot \frac{\partial}{\partial z}\left(\frac{C}{m}\right) \end{aligned} \quad (6)$$

region, and hence, is a uniform model. If the segregation coefficient m is not dependent on the position z and constant, the dopant flux Fs is expressed as below, indicating that regular diffusion prevails:

$$Fs = -D\frac{\partial C}{\partial z}$$

If the segregation coefficient m is dependent on the position z, the dopant flux Fs, which is expressed as Eq. 7, represents an impurity flux across the interface.

(B-3). Computation of Impurity Concentration

Using the segregation model described in the preceding section (B-2), the dopant flux Fs is computed in the step S105 of FIG. 7. A computation method used in the step S105 is typically the Defaut Flaukel method or the RRK method.

FIG. 9 is a flow chart depicting the step S105 in detail. In a step S51, the diffusion coefficient D and the segregation coefficient m are calculated from the process temperature T, followed by computation of the dopant flux Fs according to Eq. 6 (step S52).

Next, in the step S106 (FIG. 8), the time step $\Delta t$ is determined in accordance with the dopant flux Fs at a time t, and a quantity of dopants which flow during the time step $\Delta t$ is computed (step S110). Since the quantities of dopants flowing across neighboring cells are known, an impurity concentration in each cell is found (step S111).

(B-4). Modification

Figure 10:
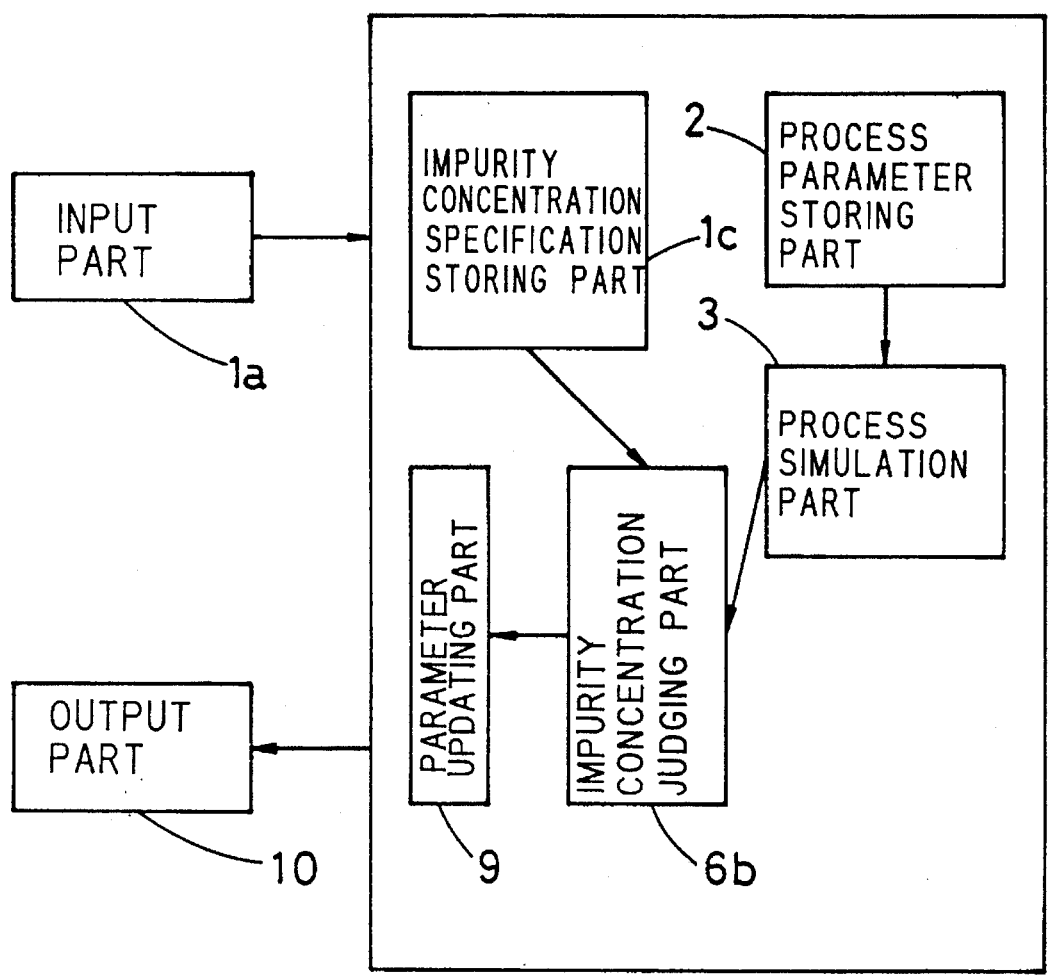
FIG. 10 is a block diagram for explaining another embodiment of the present invention.

The preferred embodiment heretofore described requires that the simulation at the device simulation part goes as far as computation and evaluation of the device characteristics such as the threshold voltage value. However, specifications of impurity concentration near the interface may be determined in simulation, in which case setup of parameters is realized in a system as shown in FIG. 10. The system of FIG. 10 is generally similar to that shown in FIG. 5. An impurity concentration specification storing part 1c is provided instead of the threshold voltage specification storing part 1b, and impurity concentration judging part 6b is installed to replace the threshold voltage judging part 6a. The device simulation part 4, the threshold voltage computing part 5a and the threshold voltage storing part 5b may be omitted.

In the system of FIG. 10, the program simulation part 3 computes an impurity concentration C which is thereafter compared with the specifications of impurity concentration which were stored beforehand in the impurity concentration specification storing part 1c. If the concentration specification storing part 1c judges that the impurity concentration C does not fall within the predetermined specifications, the parameter updating part 9 updates the parameters therein and the computation is continued using the new parameters.

Figure 11:
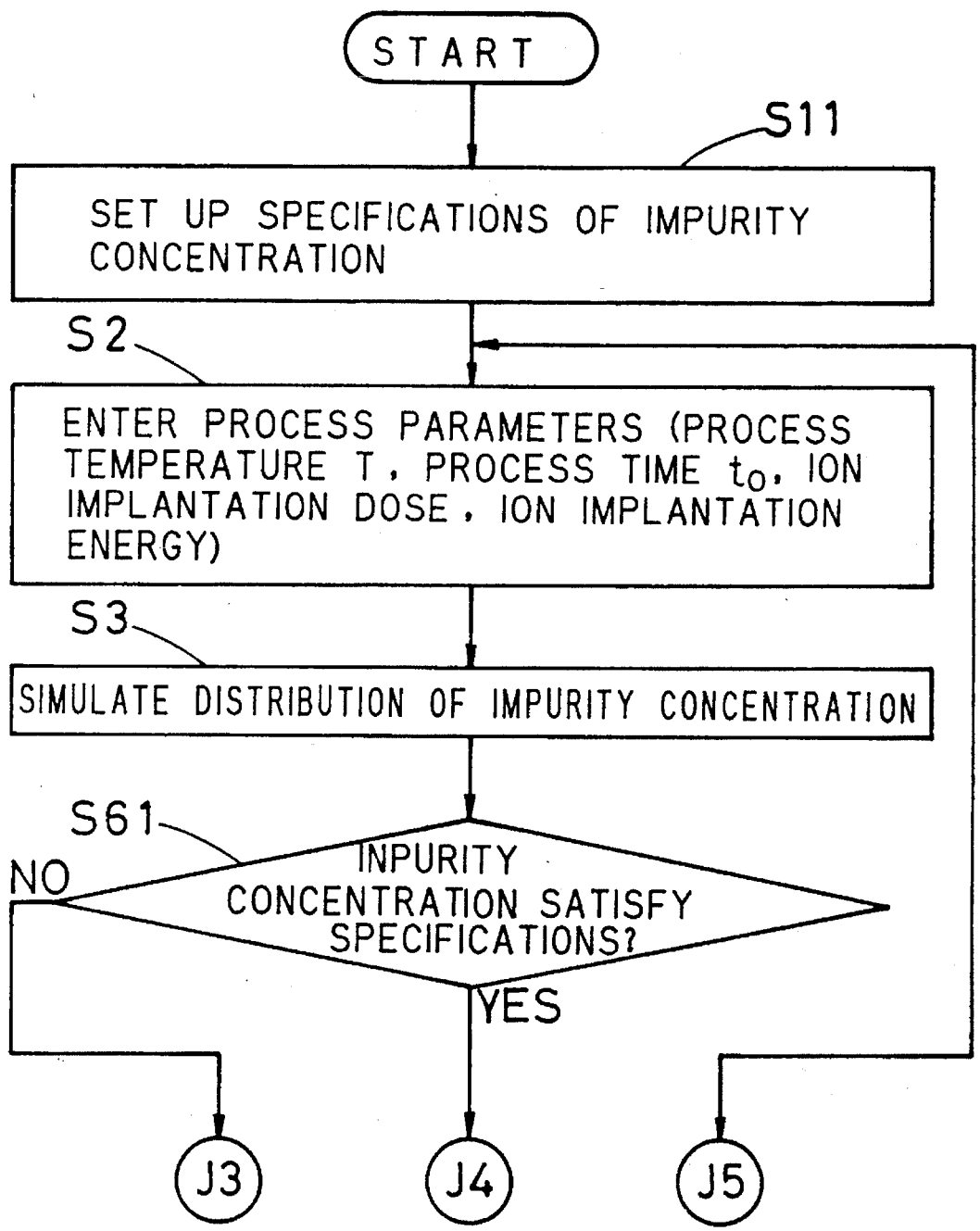
FIGS. 11 and 12 show in combination a flow chart which explains the another embodiment.
Figure 12:
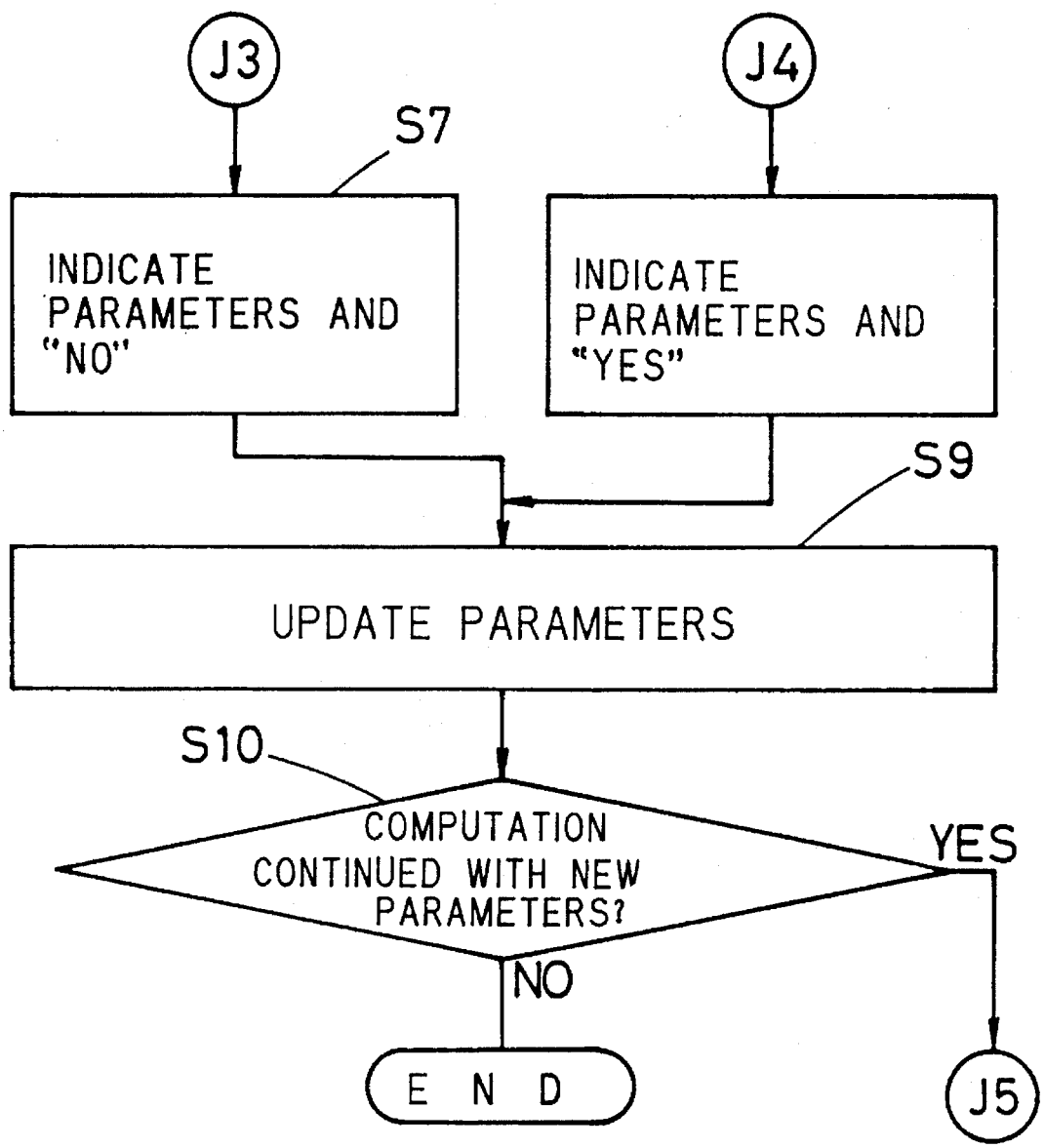

The sequence of this is shown in a flow chart of FIGS. 11 and 12. First, the specifications of impurity concentration are set up (step S11), and the parameters of the manufacturing program are entered (step S2).

Next, a distribution of the impurity concentration is simulated (step S3), and whether the computed distribution satisfies the specifications is then judged (step S61). As shown in FIG. 12, procedures which follow are exactly the same as the steps S7 to S10 of FIG. 4.

It is to be noted that the present invention is applicable to not only SiO$_2$/Si interface but also interface between Si$_3$N$_4$ (silicon nitride), polysilicon, silicide, metal and the like.

In addition, a characteristic of a semiconductor device to be evaluated need not to be a threshold value, but may be a leak current or a breakdown voltage.

While the invention has been shown and described in detail, the foregoing description is in all aspects illustrative and not restrictive. It is understood that numerous modifications and variations can be devised without departing from the scope of the invention.

I claim:

1. A method of setting up process parameters which are used in a manufacturing process of a semiconductor device, comprising the steps of:

(a) entering a plurality of process parameters;

(b) calculating an impurity concentration C which will be observed in said semiconductor device using said process parameters, said impurity concentration C being a function of a position z within said semiconductor device;

(c) judging whether said impurity concentration C has a predetermined value;

(d) if a judgement at said step (c) is "No," updating said process parameters and repeating said steps (b) and (c) until said judgement at said step (c) becomes "Yes;" and (e) determining said process parameters with which said judgement at said step (c) is "Yes" as process parameters to be obtained, wherein said step (b) involves defining a boundary region between abutting first and second materials and performing a calculation using a model in which said impurity concentration C continuously varies with said position z across said boundary region.

2. The method of claim 1, comprising manufacturing said semiconductor device using said process parameters with which said judgement at said judging step is "Yes."

3. A method of setting up process parameters which are used in a manufacturing process of a semiconductor device, comprising the steps of:

entering a plurality of process parameters;

determining a portion of said device to be analyzed;

partitioning said portion in cells;

assigning an initial impurity concentration in each of said cells;

calculating an impurity concentration C which will be observed in said semiconductor device using said process parameters, said impurity concentration C being a function of a position z in said semiconductor device and a time t;

simulating a characteristic of said semiconductor device from said impurity concentration C;

judging whether said characteristic has a predetermined value;

if a judgement at said step (d) is "No," updating said process parameters and repeating said calculating and judging steps until said judgement at said judging step becomes "Yes;"

setting up said process parameters with which said judgement at said judging step is "Yes" as process parameters to be obtained, wherein said calculating step involves defining a boundary region having a predetermined width between abutting first and second materials in said portion and performing a calculation using a model in which said impurity concentration C continuously varies with said position z across said boundary regions.

4. The method of claim 3, wherein calculating said involves at least one of diffusion calculation, oxidation calculation and epitaxy calculation, said diffusion calculation, said oxidation calculation and said epitaxy calculation corresponding to diffusion process, oxidation process and epitaxy process, respectively.

5. The method of claim 4, wherein said process parameters include a process temperature T, a process time $t_0$, an ion implantation dose and an ion implantation energy.

6. The method of claim 5, wherein said calculating step further involves ion implantation calculation which corresponds to ion implantation process.

7. The method of claim 6, wherein said step calculating includes:

in said ion implantation calculation, calculating an initial value of said impurity concentration C from said ion implantation does and said ion implantation energy;

in said diffusion calculation, calculating a dopant flux Fs at a time t using said impurity concentration C and said process temperature T, updating said impurity concentration C using said dopant flux Fs, and adding a predetermined time step to said time to thereby update said time t, and repeating said steps of calculating said dopant flux Fs and updating until the calculation arrives at said process time $t_0$.

8. The method of claim 7, wherein said step of calculating said dopant flux Fs includes the steps of:

calculating a diffusion coefficient D from said process temperature T;

calculating a segregation coefficient m from said process temperature T; and calculating said dopant flux Fs from said diffusion coefficient D, said segregation coefficient m and said impurity concentration C, according to the equation below $$Fs = -D \cdot m \cdot [\partial (C/m)/\partial z].$$

9. The method of claim 8, wherein said predetermined time step is determined from said dopant flux Fs.

10. The method of claim 9, said step of calculating said impurity concentration C further involves etching calculation, deposition calculation and optical lithography calculation which corresponds to etching process, deposition process and optical lithography process, respectively.

11. The method of claim 10, wherein said semiconductor device is a MOS transistor and said characteristic is a threshold value of said MOS transistor.

12. An apparatus for setting up process parameters which are used in a manufacturing process of a semiconductor device, comprising:

an input part to which a plurality of process parameters are entered;

a process simulation part for calculating an impurity concentration C which will be observed in said semiconductor device using said process parameters, said impurity concentration C being a function of a position z within said semiconductor device and a time t;

a judging part for judgement whether said impurity concentration C has a predetermined value;

a parameter updating part for updating said process parameters if said judgement is "No" until said judgement becomes "Yes;" and an output part for determining said process parameters with which said judgement is "Yes" as process parameters to be obtained and outputting said process parameters, wherein in said process simulation part, a boundary region between abutting first and second materials is defined and a calculation is performed using a model in which said impurity concentration C continuously varies with said position z across said boundary region.

13. The apparatus of claim 12, wherein said process simulation part performs at least one of diffusion calculation, oxidation calculation and epitaxy calculation, said diffusion calculation, said oxidation calculation and said epitaxy calculation corresponding to diffusion process, oxidation process and epitaxy process, respectively.

14. The apparatus of claim 13, wherein said process parameters include a process temperature T, a process time $t_0$, an ion implantation dose and an ion implantation energy.

15. The apparatus of claim 14, wherein said process simulation part further performs ion implantation calculation which corresponds to ion implantation process.

16. The apparatus of claim 15, wherein in said ion implantation calculation, an initial value of said impurity concentration C is calculated from said ion implantation dose and said ion implantation energy;

in said diffusion calculation, a dopant flux Fs at a time t is calculated from said impurity concentration C and said process temperature T, a predetermined time step is added to said time t to thereby update said time t, update of said impurity concentration C is continued using said dopant flux Fs until the calculation arrives at said process time $t_0$.

17. The apparatus of claim 16, wherein a diffusion coefficient D and a segregation coefficient m are calculated from said process temperature T, and thereafter, said dopant flux Fs is calculated from said diffusion coefficient D, said segregation coefficient m and said impurity concentration C, according to the equation below $$Fs = -D \cdot m \cdot [\partial (C/m)/\partial z].$$

18. The apparatus of claim 17, wherein said predetermined time step is determined from said dopant flux Fs.

19. The apparatus of claim 18, wherein said process simulation part performs etching calculation, deposition calculation and optical lithography calculation which correspond to etching process, deposition process and optical lithography process, respectively.

20. The method of claim 19, wherein said semiconductor device is a MOS transistor and said characteristic is a threshold value of said MOS transistor.

21. A method of manufacturing a semiconductor device, comprising the step of:

obtaining a first set of process parameters;

determining an impurity concentration in said semiconductor device using said process parameters, said impurity concentration being a function of position in said semiconductor device and a time t, using a model in which said impurity concentration C continuously varies with said position z across boundary regions defined in said device;

simulating a characteristic of said semiconductor device from said impurity concentration;

determining if said characteristic has a predetermined value;

updating said process parameters if said characteristic does not have said predetermined value and repeating said determining steps until said characteristic has said predetermined value;

obtaining a second set of process parameters with which said characteristic has said predetermined value; and manufacturing said semiconductor device using said second set of process parameters.

22. An apparatus for setting up process parameters which are used in a manufacturing process of a semiconductor device, comprising:

an input part to which a plurality of process parameters are entered;

a process simulation part determining a portion of said device to be analyzed, for partitioning said device into cells, and for calculating an impurity concentration C which will be observed in said semiconductor device using said process parameters, said impurity concentration C being a function of a position z within said semiconductor device;

a judging part for judgement whether said impurity concentration C has a predetermined value;

a parameter updating part for updating said process parameters if said judgement is "No" until said judgement becomes "Yes;" and an output part for determining said process parameters with which said judgement is "Yes" as process parameters to be obtained and outputting said process parameters, wherein in said process simulation part, a boundary region between abutting first and second materials is defined and a calculation is performed using a model in which said impurity concentration C continuously varies with said position z across said boundary region.

\* \* \* \* \*